United States Patent
Lin et al.

(10) Patent No.: US 8,836,632 B2
(45) Date of Patent: Sep. 16, 2014

(54) SHIFT REGISTER AND TOUCH DEVICE

(75) Inventors: Ku-Liang Lin, Hsin-Chu (TW);
Wen-Kai Shih, Hsin-Chu (TW);
Sheng-Liang Hsieh, Hsin-Chu (TW)

(73) Assignee: AU Optronics Corp., Hsinchu (TW)

( * ) Notice: Subject to any disclaimer, the term of this patent is extended or adjusted under 35 U.S.C. 154(b) by 557 days.

(21) Appl. No.: 13/051,484

(22) Filed: Mar. 18, 2011

(65) Prior Publication Data

US 2012/0105338 A1    May 3, 2012

(30) Foreign Application Priority Data

Oct. 27, 2010   (TW) ............................... 99136765 A

(51) Int. Cl.
*G09G 3/36* (2006.01)
*G11C 19/28* (2006.01)
*G06F 3/041* (2006.01)

(52) U.S. Cl.
CPC .............. *G06F 3/0416* (2013.01); *G11C 19/28* (2013.01)
USPC ........... 345/100; 345/173; 345/208; 345/212; 377/69; 377/78; 377/79

(58) Field of Classification Search
USPC .......... 345/98–100, 173–183; 377/29, 43, 57, 377/64, 69, 78, 79
See application file for complete search history.

(56) References Cited

U.S. PATENT DOCUMENTS

| | | | |
|---|---|---|---|
| 5,070,406 A | 12/1991 | Kinoshita | |
| 2007/0146289 A1* | 6/2007 | Lee et al. | 345/100 |
| 2008/0246739 A1 | 10/2008 | Choi et al. | |
| 2008/0284698 A1* | 11/2008 | Lee et al. | 345/87 |
| 2010/0097340 A1* | 4/2010 | Mizuhashi et al. | 345/173 |
| 2011/0058642 A1 | 3/2011 | Tsai et al. | |
| 2011/0293063 A1 | 12/2011 | Tsai et al. | |

FOREIGN PATENT DOCUMENTS

CN           101661798          3/2010

OTHER PUBLICATIONS

Taiwan Patent Office, "Office Action", Nov. 29, 2013.

* cited by examiner

*Primary Examiner* — Srilakshmi K Kumar
*Assistant Examiner* — Insa Sadio
(74) *Attorney, Agent, or Firm* — WPAT, PC; Justin King

(57) ABSTRACT

A touch device includes gate lines, pixels, sense control lines and sense units. Each pixel is connected to one of the gate lines and is decided whether to receive data according to a voltage on the gate line. Each the sense unit is connected to one of the sense control lines and is decided whether to perform a touch sense operation according to a voltage on the sense control line. The touch device further includes a shift register string including cascade-connected shift registers. Each shift register has first and second output terminals. The first output terminal provides an output to one of the gate lines according to a first clock signal to control the voltage on the gate line. The second output terminal provides an output to one of the sense control lines according to a second clock signal to control the voltage on the detection control line.

10 Claims, 3 Drawing Sheets

SHIFT REGISTER AND TOUCH DEVICE

FIELD OF THE INVENTION

The present invention relates to display and touch control technologies, and more particularly to a shift register and a touch device.

BACKGROUND OF THE INVENTION

With the development of science and technology, flat panel display devices (e.g., liquid crystal display devices) have many advantages of high display quality, small volume, light weight and wide application range and thus are widely used in consumer electronics products such as mobile phones, laptop computers, desktop computers and televisions, etc. Moreover, the liquid crystal display devices have evolved into a mainstream display in place of cathode ray tube (CRT) displays.

In another aspect, touch panels provide a new human-machine interaction interface and are more intuitive, more in accord with humanity in use. The solution of integrating a touch panel with a flat panel display device to constitute a display touch panel so as to allow the flat panel display device to be endowed with touch function will be a potential application development trend to the flat panel display devices.

In order to make the display products be more slim and more competitive in cost, a display device is prone to use a gate-on-array (GOA) type gate driving circuit to generate gate driving signals. Generally, the GOA type gate driving circuit includes multiple shift registers connected in cascade for sequentially outputting multiple gate driving signals. The output of each shift register further can be used as a start pulse signal of the next-staged shift register.

However, with regard to a display device integrated with a capacitive touch panel in the prior art, since the capacitive touch panel generally receives a continuous clock signal and then use a multiplexer to distribute the clock signal to multiple sense control lines as driving signals for driving sense units respectively electrically coupled to the sense control lines and thereby determining the sense units each whether to perform a touch sense operation. As a result, the amount of output channels of the multiplexer inevitably is needed to be increased along the increase of the required resolution of the touch panel. Accordingly, when the resolution of the touch panel is required to be increased, the cost of the multiplexer would be greatly increased consequently.

SUMMARY OF THE INVENTION

Therefore, the present invention is directed to a shift register, for reducing the cost of a touch device to which the shift register is applied.

The present invention is further directed to a touch device with reduced cost.

In one aspect, a shift register in accordance with an embodiment of the present invention includes a pull-up module, an output module and a stabilization module. The pull-up module is electrically coupled to receive an input signal and provides the input signal to an output terminal of the pull-up module. The output module has a first output terminal and a second output terminal. The output module is electrically coupled to receive a first clock signal and a second clock signal different from each other. The output module is further electrically coupled to the output terminal of the pull-up module and thereby determines whether to provide the first clock signal and the second clock signal respectively to the first output terminal and the second output terminal according to a voltage on the output terminal of the pull-up module. The stabilization module is electrically coupled to the output terminal of the pull-up module, the first output terminal and the second output terminal to thereby stabilize the output terminal of the pull-up module, the first output terminal and the second output terminal to a designated voltage in a particular time.

In one embodiment, in an enable period of the first clock signal, the second clock signal has multiple pulses.

In one embodiment, the pull-up module includes a transistor. The transistor has a gate, a first source/drain and a second source/drain. The gate and the first source/drain of the transistor both are electrically coupled to receive the input signal, and the second source/drain of the transistor serves as the output terminal of the pull-up module.

In one embodiment, the output module includes a first transistor and a second transistor. The first transistor has a gate, a first source/drain and a second source/drain, the gate of the first transistor is electrically coupled to the output terminal of the pull-up module, the first source/drain of the first transistor is electrically coupled to receive the first clock signal, and the second source/drain of the first transistor acts as the first output terminal. The second transistor has a gate, a first source/drain and a second source/drain, the gate of the second transistor is electrically coupled to the output terminal of the pull-up module, the first source/drain of the second transistor is electrically coupled to receive the second clock signal, and the second source/drain of the second transistor acts as the second output terminal.

In one embodiment, the stabilization module includes a first transistor, a second transistor and a third transistor. The first transistor has a gate, a first source/drain and a second source/drain, the gate of the first transistor is electrically coupled to receive a stabilizing control signal to thereby switch on the first transistor in the particular time, the first source/drain of the first transistor is electrically coupled to the output terminal of the pull-up module, and the second source/drain of the first transistor is electrically coupled to the designated voltage. The second transistor has a gate, a first source/drain and a second source/drain, the gate of the second transistor is electrically coupled to receive the stabilizing control signal to thereby switch on the second transistor in the particular time, the first source/drain of the second transistor is electrically coupled to the first output terminal, and the second source/drain of the second transistor is electrically coupled to the designated voltage. The third transistor has a gate, a first source/drain and a second source/drain, the gate of the third transistor is electrically coupled to receive the stabilizing control signal to thereby switch on the third transistor in the particular time, the first source/drain of the third transistor is electrically coupled to the second output terminal, and the second source/drain of the third transistor is electrically coupled to the designated voltage.

In another aspect, a touch device in accordance with an embodiment of the present invention includes multiple gate lines, multiple pixels, multiple sense control lines and multiple sense units. Each of the pixels is electrically coupled to one of the gate lines to thereby determine whether to receive data according to a voltage on the gate line. Each of the sense units is electrically coupled to one of the sense control lines to thereby determine whether to perform a touch sense operation according to a voltage on the sense control line. Moreover, the touch device further includes a shift register string including multiple shift registers connected in cascade. Each of the shift registers has a first output terminal and a second output terminal, the first output terminal is to provide an output to one of the gate lines according to a first clock signal to thereby control the voltage on the gate line, the second output terminal is to provide an output to one of the sense control lines according to a second clock signal to thereby control the voltage on the sense control line. The first clock signal and the second clock signal are different from each other, for example, in an enable period of the first clock signal, the second clock signal has multiple pulses.

In summary, in the various embodiments of the present invention, by way of the particular circuit design to the shift register (e.g., using two transistors simultaneously output a gate driving signal and a touch driving signal respectively) cooperative with hybrid control sequences (e.g., using multiple clock signals with different frequencies), the cost caused by the increase of the required resolution of touch panel can be greatly reduced as a result.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
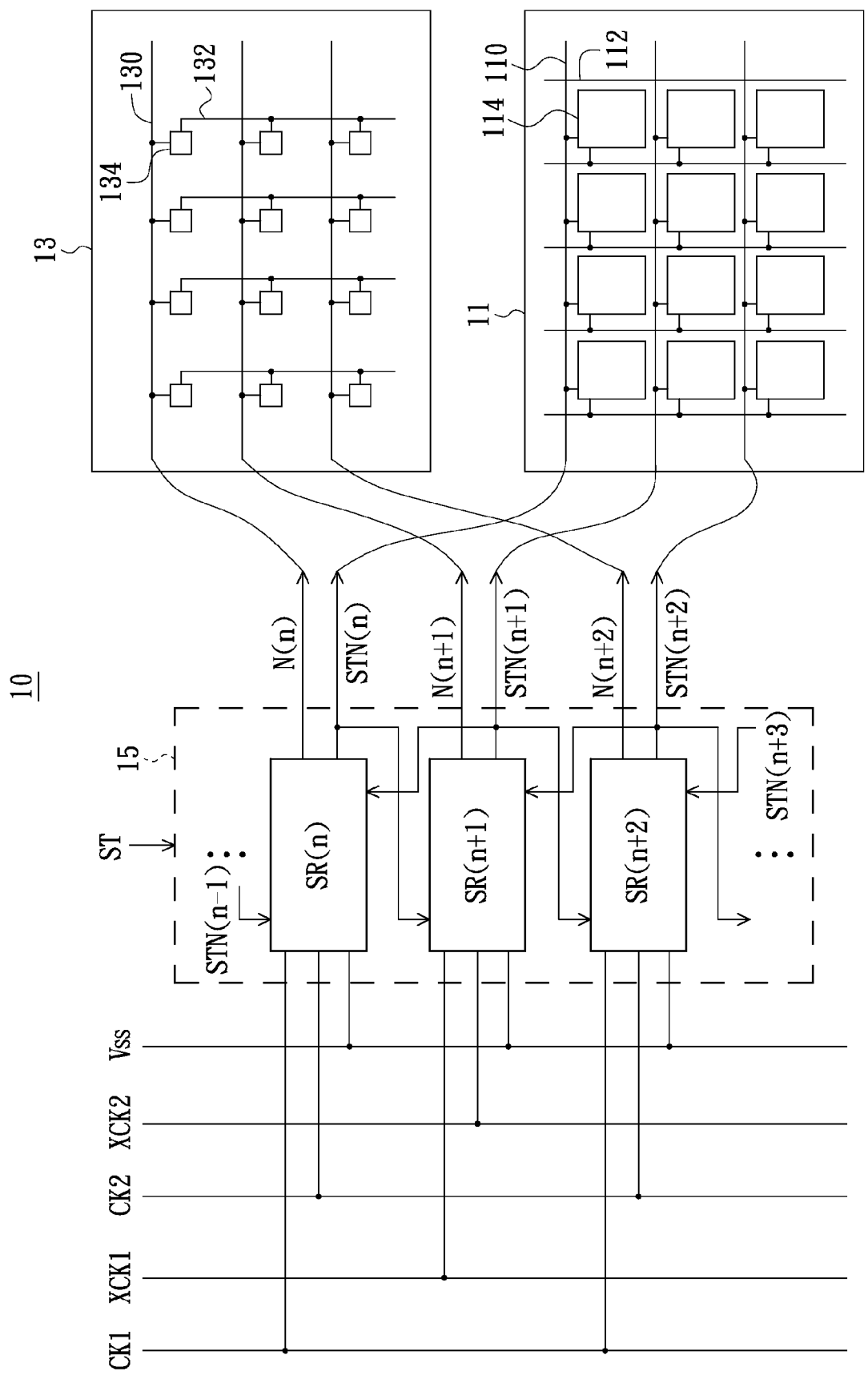
FIG. 1 is a schematic structure view of a touch device in accordance with an embodiment of the preset invention.

Referring to FIG. 1, a schematic structure view of a touch device in accordance with an embodiment of the present is shown. As illustrated in FIG. 1, the touch device 10 is endowed with display and touch functions. In particular, the touch device 10 includes a display part 11, a touch part 13 and a shift register string 15. The display part 11 includes multiple gate lines 110, multiple data lines 112 and multiple pixels 114. The gate lines 100 and the data lines 112 extend along two different directions. Each of the pixels 114 is electrically coupled to one of the gate lines 110 and one of the data lines 112 and thereby is determined whether to receive a display data from the data line 112 according to a voltage on the gate line 110. The touch part 13 includes multiple sense control lines 130, multiple readout lines 132 and multiple sense units 134. The sense control lines 130 and the readout lines 132 extend along two different directions. Each of the sense units 134 is electrically coupled to one of the sense control lines 130 and one of the readout lines 132 and thereby is determined whether to perform a touch sense operation according to a voltage on the sense control line 130. When a certain one sense unit 134 performs a touch sense operation, a touch result can be read out from the readout line 132 electrically coupled to the sense unit 134. Herein, it is indicated that, the amounts of the gate lines 110, the data lines 112, the pixels 114, the sense control lines 130, the readout lines 132 and the sense units 134 in FIG. 1 only are illustrative, but not to limit the present invention.

The shift register string 15 is electrically coupled to receive clock signals CK1, XCK1, CK2, XCK2 provided from an external circuit e.g., a timing controller and further electrically coupled to receive a start pulse signal ST. The shift register string 15 includes multiple shift registers e.g., SR(n), SR(n+1), SR(n+2) connected in cascade. Each of the shift registers SR(n), SR(n+1) and SR(n+2) outputs a corresponding one of gate driving signals STN(n), STN(n+1), STN(n+2) and a corresponding one of touch driving signals N(n), N(n+1), N(n+2) respectively at two output terminals thereof according to two clock signals (e.g., CK1 and CK2, or XCK1 and XCK2). Herein, the output terminal of each of the shift registers SR(n), SR(n+1), SR(n+2) for outputting the corresponding one of the gate driving signals STN(n), STN(n+1), STN(n+2) is electrically coupled to a corresponding one of the gate lines 110 of the display part 11, and the output terminal for outputting the corresponding one of the touch driving signals N(n), N(n+1), N(n+2) is electrically coupled to a corresponding one of the sense control lines 130 of the touch part 13.

More specifically, the shift register SR(n) is electrically coupled to receive the clock signal CK1, CK2 and a grounding level Vss. The shift register SR(n) is subjected to the control of gate driving signals STN(n−1), STN(n+1) and outputs the gate driving signal STN(n) and the touch driving signal N(n) respectively to a corresponding gate line 110 of the display part 11 and a corresponding sense control line 130 of the touch part 13 according to the clock signals CK1, CK2. Similarly, the shift register SR(n+1) is electrically coupled to receive the clock signal XCK1, XCK2 and the grounding level Vss. The shift register SR(n+1) is subjected to the control of gate driving signals STN(n), STN(n+2) and outputs the gate driving signal STN(n+1) and the touch driving signal N(n+1) respectively to a corresponding gate line 110 of the display part 11 and a corresponding sense control line 130 of the touch part 13 according to the clock signals XCK1, XCK2. The shift register SR(n+2) is electrically coupled to receive the clock signal CK1, CK2 and the grounding level Vss. The shift register SR(n+2) is subjected to the control of gate driving signals STN(n+1), STN(n+3) and outputs the gate driving signal STN(n+2) and the touch driving signal N(n+2) respectively to a corresponding gate line 110 of the display part 11 and a corresponding sense control line 130 of the touch part 13 according to the clock signals CK1, CK2.

Figure 2:
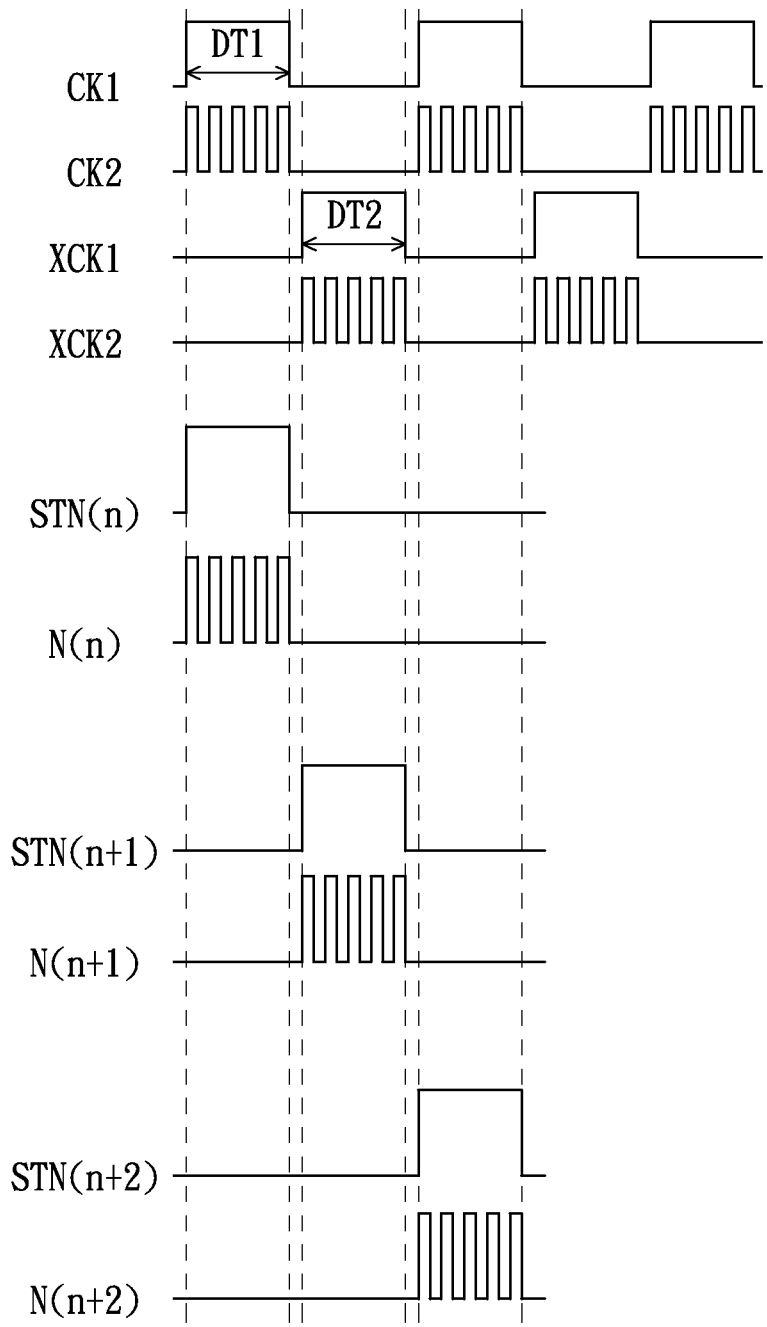
FIG. 2 is a timing diagram of multiple signals of the touch device in FIG. 1.

Referring to FIG. 2, a timing diagram of the clock signals CK1, XCK1, CK2, XCK2, the gate driving signals STN(n), STN(n+1), STN(n+2), and the touch driving signals N(n), N(n+1), N(n+2) associated with the touch device 10 in FIG. 1 is shown. As seen from FIG. 2, the clock signal CK2 has a higher frequency than the clock signal CK1. In an enable period DT1 of the clock signal CK1, the clock signal CK2 has multiple pulses; while in a disable period (not labeled in FIG. 2) of the clock signal CK1, the clock signal CK2 has no pulse. Similarly, the clock signal XCK2 has a higher frequency than the clock signal XCK1. In an enable period DT2 of the clock signal XCK1, the clock signal XCK2 has multiple pulses; while in a disable period (not labeled in FIG. 2) of the clock signal XCK1, the clock signal XCK2 has no pulse. In addition, the gate driving signals STN(n), STN(n+1), STN(n+2) are sequentially outputted, and the touch driving signals N(n), N(n+1), N(n+2) also are sequentially outputted. Moreover, the gate driving signal e.g., SRN(n) and the touch driving signal e.g., N(n) of a same shift register SR(n) are simultaneously outputted.

Figure 3:
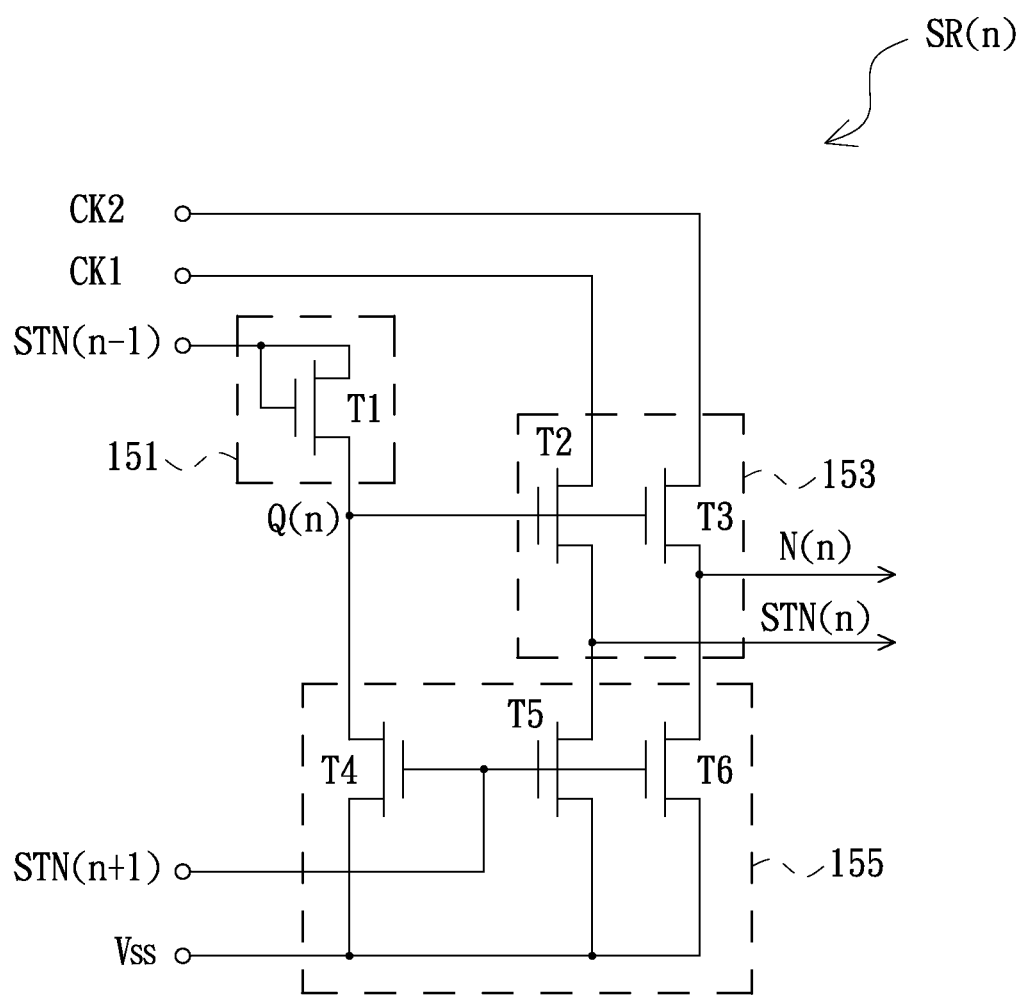
FIG. 3 is a schematic internal circuit structure of a shift register in the touch device of FIG. 1.

In the following, an internal circuit structure of any one of the shift registers SR(n), SR(n+1), SR(n+2) of the touch device 10 in FIG. 1 will be described in detail to illustrate an operation principle of the shift registers SR(n), SR(n+1), SR(n+2) simultaneously producing a gate driving signal and a touch driving signal according to two clock signals with different frequencies. In the illustrated embodiment, since the shift registers SR(n), SR(n+1), SR(n+2) can have a same internal circuit structure, only the shift register SR(n) herein is taken as an example. As illustrated in FIG. 3, the shift register SR(n) includes a pull-up module 151, an output module 153 and a stabilization module 155.

The pull-up module 151 includes a transistor T1. The transistor T1 has a gate, a drain/source and a source/drain, the gate and the drain/source of the transistor T1 both are electrically coupled to receive the gate driving signal STN(n−1) outputted from the previous-staged shift register as an input signal, and the source/drain of the transistor T1 acts as the output terminal of the pull-up module 151 to output an enable signal Q(n).

The output module 153 includes transistors T2 and T3. Each of the transistors T2, T3 has a gate, a drain/source and a source/drain. The gates of the transistors T2, T3 both are electrically coupled to the output terminal of the pull-up module 151 to thereby determine whether to switch on the transistors T2, T3 according to a voltage of the enable signal Q(n), the drain/source of the transistor T2 is electrically coupled to receive the clock signal CK1, the source/drain of the transistor T2 acts as the output terminal for outputting the gate driving signal STN(n), the drain/source of the transistor T3 is electrically coupled to receive the clock signal CK2, and the source/drain of the transistor T3 acts as the output terminal for outputting the touch driving signal N(n). In the illustrated embodiment, in the period of the enable signal Q(n) being a high voltage level, the transistors T2, T3 are switched on, the clock signals CK1, CK2 respectively are delivered to the two output terminals of the output module 153 through the switched-on transistors T2, T3. After the enable signal Q(n) jumps to a low voltage level, the transistors T2, T3 both are switched off, the clock signals CK1, CK2 both are stopped being delivered to the two output terminals of the output module 153 correspondingly.

The stabilization module 155 includes transistors T4, T5, T6. Each of the transistors T4, T5, T6 has a gate, a drain/source and a source/drain. The gates of the transistors T4, T5, T6 all are electrically coupled to receive the gate driving signal STN(n+1) outputted form the next-staged shift register as a stabilizing control signal, the drain/source of the transistor T4 is electrically coupled to the output terminal of the pull-up module 151, the drains/sources of the transistors T5, T6 respectively are electrically couple to the two output terminals of the output module 153, the sources/drains of the transistors T4, T5, T6 all are electrically coupled to a designated voltage e.g., the grounding level Vss. In the illustrated embodiment, in the period of the stabilizing control signal STN(n+1) being a high voltage level, the transistors T2, T3 are switched-off, while the transistors T4, T5, T6 all are switched-on, so that voltages respectively on the output terminal of the pull-up module 151 and the two output terminals of the output module 153 are pulled to the grounding level Vss.

It is indicated that, the shift register SR(n) is not limited to use the STN(n−1) as the input signal and use the STN(n+1) as the stabilizing control signal, the designer can flexibly set the input signal and the stabilizing control signal according to the actual requirement. In addition, the pull-up module 151, the output module 153 and the stabilization module 155 in the shift register SR(n) are not limited to have the circuit structures as illustrated in FIG. 3, as long as they can simultaneously output a gate driving signal and a touch driving signal with different frequencies according to multiple clock signals.

Sum up, in the various embodiments of the present invention, owing to the particular circuit design to the shift register (e.g., using two transistors simultaneously output a gate driving signal and a touch driving signal respectively) cooperative with hybrid control sequences (e.g., using multiple clock signals with different frequencies), the cost caused by the increase of the required resolution of touch panel can be greatly reduced.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A shift register comprising:
    a pull-up module, electrically coupled to receive an input signal to thereby deliver the input signal to an output terminal of the pull-up module;
    an output module, comprising a first output terminal and a second output terminal, wherein the output module is electrically coupled to receive a first clock signal and a second clock signal different from each other, the output module further is electrically coupled to the output terminal of the pull-up module to thereby determine whether to provide the first clock signal and the second clock signal respectively to the first output terminal and the second output terminal according to a voltage on the output terminal of the pull-up module; and
    a stabilization module, electrically coupled to the output terminal of the pull-up module, the first output terminal and the second output terminal to thereby stabilize the output terminal of the pull-up module, the first output terminal and the second output terminal to a designated voltage in a particular time.

2. The shift register according to claim 1, wherein in an enable period of the first clock signal, the second clock signal comprises a plurality of pulses.

3. The shift register according to claim 1, wherein the pull-up module comprises a transistor, the transistor comprises a gate, a first source/drain and a second source/drain, the gate and the first source/drain of the transistor both are electrically coupled to receive the input signal, and the second source/drain of the transistor serves as the output terminal of the pull-up module.

4. The shift register according to claim 1, wherein the output module comprises:
    a first transistor, comprising a gate, a first source/drain and a second source/drain, the gate of the first transistor is electrically coupled to the output terminal of the pull-up module, the first source/drain of the first transistor is electrically coupled to receive the first clock signal, and the second source/drain of the first transistor serves as the first output terminal; and
    a second transistor, comprising a gate, a first source/drain and a second source/drain, the gate of the second transistor is electrically coupled to the output terminal of the pull-up module, the first source/drain of the second transistor is electrically coupled to receive the second clock signal, and the second source/drain of the second transistor serves as the second output terminal.

5. The shift register according to claim 1, wherein the stabilization module comprises:
a first transistor, comprising a gate, a first source/drain and a second source/drain, the gate of the first transistor is electrically coupled to receive a stabilizing control signal to thereby switch on the first transistor in the particular time, the first source/drain of the first transistor is electrically coupled to the output terminal of the pull-up module, and the second source/drain of the first transistor is electrically coupled to the designated voltage;
a second transistor, comprising a gate, a first source/drain and a second source/drain, the gate of the second transistor is electrically coupled to receive the stabilizing control signal to thereby switch on the second transistor in the particular time, the first source/drain of the second transistor is electrically coupled to the first output terminal, and the second source/drain of the second transistor is electrically coupled to the designated voltage; and
a third transistor, comprising a gate, a first source/drain and a second source/drain, the gate of the third transistor is electrically coupled to receive the stabilizing control signal to thereby switch on the third transistor in the particular time, the first source/drain of the third transistor is electrically coupled to the second output terminal, and the second source/drain of the third transistor is electrically coupled to the designated voltage.

6. A touch device comprising a plurality of gate lines, a plurality of pixels, a plurality of sense control lines and a plurality of sense units, wherein each of the pixels is electrically coupled to one of the gate lines and thereby is determined whether to receive a data according to a voltage on the gate line, each of the sense units is electrically coupled to one of the sense control lines to thereby perform a touch sense operation according to a voltage on the sense control line, the touch device is characterized in that:
the touch device further comprises a shift register string comprising a plurality of shift registers connected in cascade, each of the shift registers comprises a first output terminal and a second output terminal, the first output terminal is for providing an output to one of the gate lines according to a first clock signal to thereby control the voltage on the gate line, the second output terminal is for providing an output to one of the sense control lines according to a second clock signal to thereby control the voltage on the sense control line, and the first clock signal is different from the second clock signal;
wherein each of the shift registers comprises:
a pull-up module, electrically coupled to receive an input signal to thereby provide the input signal to an output terminal of the pull-up module;
an output module, comprising the first output terminal and the second output terminal, wherein the output module is electrically coupled to receive the first clock signal and the second clock signal, the output module further is electrically coupled to the output terminal of the pull-up module to thereby determine whether to provide the first clock signal and the second clock signal respectively to the first output terminal and the second output terminal according to a voltage on the output terminal of the pull-up module; and
a stabilization module, electrically coupled to the output terminal of the pull-up module, the first output terminal and the second output terminal to thereby stabilize the output terminal of the pull-up module, the first output terminal and the second output terminal to a designated voltage in a particular time.

7. The touch device according to claim 6, wherein in an enable period of the first clock signal, the second clock signal comprises a plurality of pulses.

8. The touch device according to claim 6, wherein the pull-up module comprises a transistor, the transistor comprises a gate, a first source/drain and a second source/drain, the gate and the first source/drain of the transistor both are electrically coupled to receive the input signal, and the second source/drain of the transistor serves as the output terminal of the pull-up module.

9. The touch device according to claim 6, wherein the output module comprises:
a first transistor, comprising a gate, a first source/drain and a second source/drain, the gate of the first transistor is electrically coupled to the output terminal of the pull-up module, the first source/drain of the first transistor is electrically coupled to receive the first clock signal, and the second source/drain of the first transistor serves as the first output terminal; and
a second transistor, comprising a gate, a first source/drain and a second source/drain, the gate of the second transistor is electrically coupled to the output terminal of the pull-up module, the first source/drain of the second transistor is electrically coupled to receive the second clock signal, and the second source/drain of the second transistor serves as the second output terminal.

10. The touch device according to claim 6, wherein the stabilization module comprises: a first transistor, comprising a gate, a first source/drain and a second source/drain, the gate of the first transistor is electrically coupled to receive a stabilizing control signal to thereby switch on the first transistor in the particular time, the first source/drain of the first transistor is electrically coupled to the output terminal of the pull-up module, and the second source/drain of the first transistor is electrically coupled to the designated voltage;
a second transistor, comprising a gate, a first source/drain and a second source/drain, the gate of the second transistor is electrically coupled to receive the stabilizing control signal to thereby switch on the second transistor in the particular time, the first source/drain of the second transistor is electrically coupled to the first output terminal, and the second source/drain of the second transistor is electrically coupled to the designated voltage; and a third transistor, comprising a gate, a first source/drain and a second source/drain, the gate of the third transistor is electrically coupled to receive the stabilizing control signal to thereby switch on the third transistor in the particular time, the first source/drain of the third transistor is electrically coupled to the second output terminal, and the second source/drain of the third transistor is electrically coupled to the designated voltage.

* * * * *